(12) United States Patent
Gattuso

(10) Patent No.: US 7,927,109 B1
(45) Date of Patent: Apr. 19, 2011

(54) ELECTRICAL CONNECTOR HAVING PLATED CONDUCTIVE LAYER

(75) Inventor: Andrew David Gattuso, Chandler, AZ (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/589,965

(22) Filed: Oct. 30, 2009

(51) Int. Cl.
*H01R 12/00* (2006.01)

(52) U.S. Cl. ......................................................... 439/66

(58) Field of Classification Search ............... 439/66, 439/71, 591, 83, 482
See application file for complete search history.

(56) References Cited

U.S. PATENT DOCUMENTS

| 4,636,026 | A |  | 1/1987 | Cooney et al. |  |
|---|---|---|---|---|---|
| 4,838,801 | A |  | 6/1989 | Bertoglio et al. |  |
| 5,192,213 | A |  | 3/1993 | Kosugi et al. |  |
| 5,215,472 | A |  | 6/1993 | DelPrete et al. |  |
| 5,362,241 | A |  | 11/1994 | Matsuoka et al. |  |
| 5,645,433 | A | * | 7/1997 | Johnson | 439/66 |
| 7,134,920 | B1 |  | 11/2006 | Ju et al. |  |
| 7,666,000 | B1 | * | 2/2010 | Hsiao et al. | 439/66 |
| 7,674,113 | B2 | * | 3/2010 | Di Stefano | 439/66 |
| 2004/0147140 | A1 | * | 7/2004 | Fan et al. | 439/66 |

* cited by examiner

*Primary Examiner* — Chandrika Prasad
(74) *Attorney, Agent, or Firm* — Andrew C. Cheng; Wei Te Chung; Ming Chieh Chang

(57) ABSTRACT

An electrical connector for connecting two electronic devices includes a first housing having a plurality of first through holes, a second housing mounted under the first housing and having a plurality of second through holes respectively aligning with the first through holes. An inner wall of each second through hole is plated to have a conductive layer thereon. A contacting member is attached to the conductive layer and disposed beyond a bottom surface of the second housing for engaging with one electronic device. A plurality of contacts each includes a contacting portion disposed in the first through hole for engaging the other electronic device and an engaging section disposed in the second through hole and electrically contacted with the conductive layer.

16 Claims, 8 Drawing Sheets

ELECTRICAL CONNECTOR HAVING PLATED CONDUCTIVE LAYER

BACKGROUND OF THE INVENTION

1. Field of the Invention

The present invention relates to an electrical connector, and more particularly to a socket connector having a conductive layer arranged in a lower section of a passageway so as to interconnect a contact terminal disposed within an upper portion of the passageway and a solder mass disposed at a bottom surface of the socket connector.

2. Description of Related Art

Various electrical connectors are widely used in a computer system for interconnecting two electronic devices, such as a PCB (Printed Circuit Board) and an IC (Integrated Circuit) package. These connectors each serves as a carrier for the IC package and also establishes electrical connection between the two devices.

U.S. Pat. No. 5,362,241 issued to Matsuoka et al. on Nov. 18, 1994 discloses a connector for interconnecting two electronic devices (i.e. an IC package and a PCB). The connector includes an upper insulating cover and a lower insulating housing both stack with each other and jointly define a plurality of through holes therein for retaining a multiplicity of contact arrangements, respectively. Referring to FIG. 1 and FIG. 2 of Matsuoka, the first embodiment of the contact arrangement includes an upper contact and a lower contact engaging with each other. The upper contact has a pair of legs received in a sleeve of the lower contact. When the electronic devices are loaded, the legs of the upper contact abut against an oblique inner wall of the sleeve of the lower contact and thus produce a normal force that is able to assure the reliable connection between the electronic devices and the connector.

There is another embodiment of Matsuoka as shown in FIG. 3 and FIG. 4, which is generally similar to the previous embodiment. The only difference therebetween is that the lower contact has a convex surface that engages with the legs of upper contact, thereby also producing a normal force.

Though normal force that ensures the connection between the electronic devices and the connector is generated in both of the above described contact arrangements, there is a disadvantage thereof that the contact arrangements each employs a pair of rigid metal contacts which take a large mount of metallic material and therefore is not competitive.

In view of the above, a new low profile electrical connector capable of cost-effective.

SUMMARY OF THE INVENTION

Accordingly, an object of the present invention is to provide an improved low profile electrical connector having contact arrangement of low cost.

According to one aspect of the present invention, there is provided an electrical connector for connecting two electronic devices, which includes a first housing having a plurality of first through holes, a second housing mounted under the first housing and having a plurality of second through holes aligning with the first through holes respectively. An inner wall of each second through hole is plated to have a conductive layer thereon. A contacting member is attached to the conductive layer and disposed beyond a bottom surface of the second housing for engaging with one electronic device. A plurality of contacts each includes a contacting portion disposed in the first through hole for engaging the other electronic device and an engaging section disposed in the second through hole and electrically contacted with the conductive layer.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
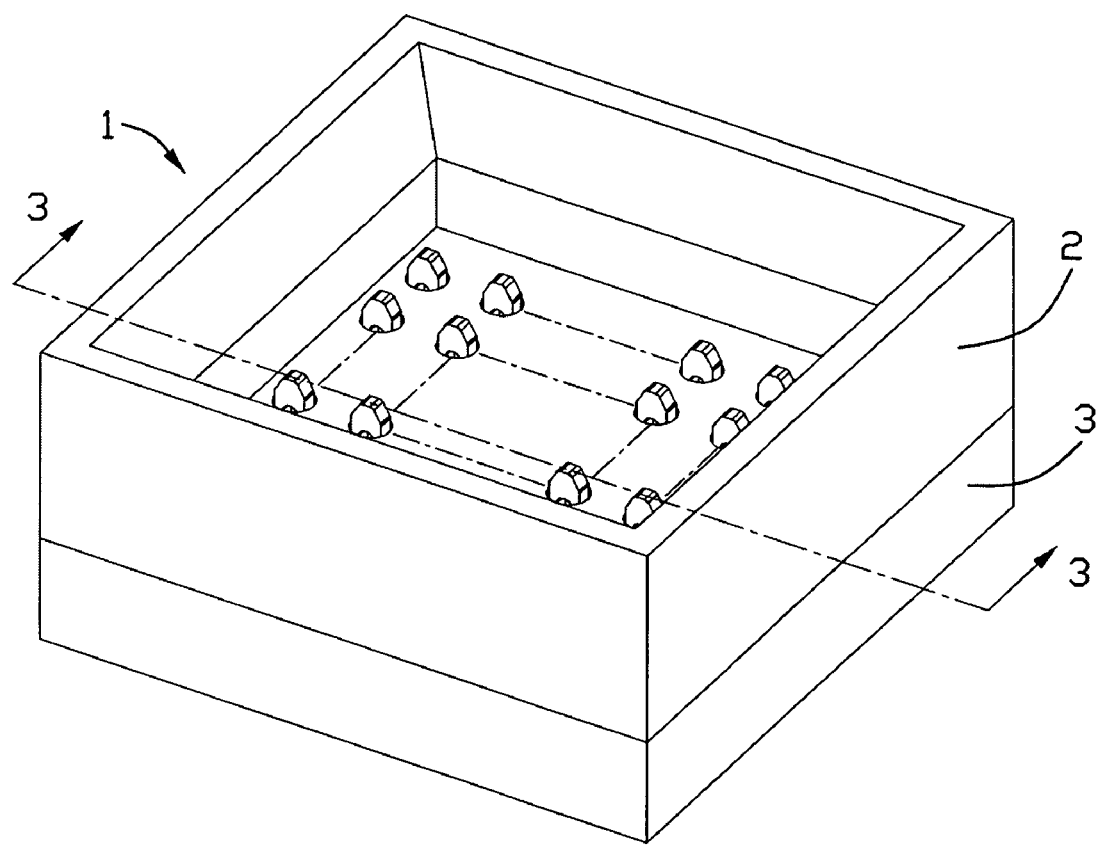
FIG. 1 is an assembled, perspective view of an electrical connector in accordance with a first preferred embodiment of the present invention.
Figure 2:
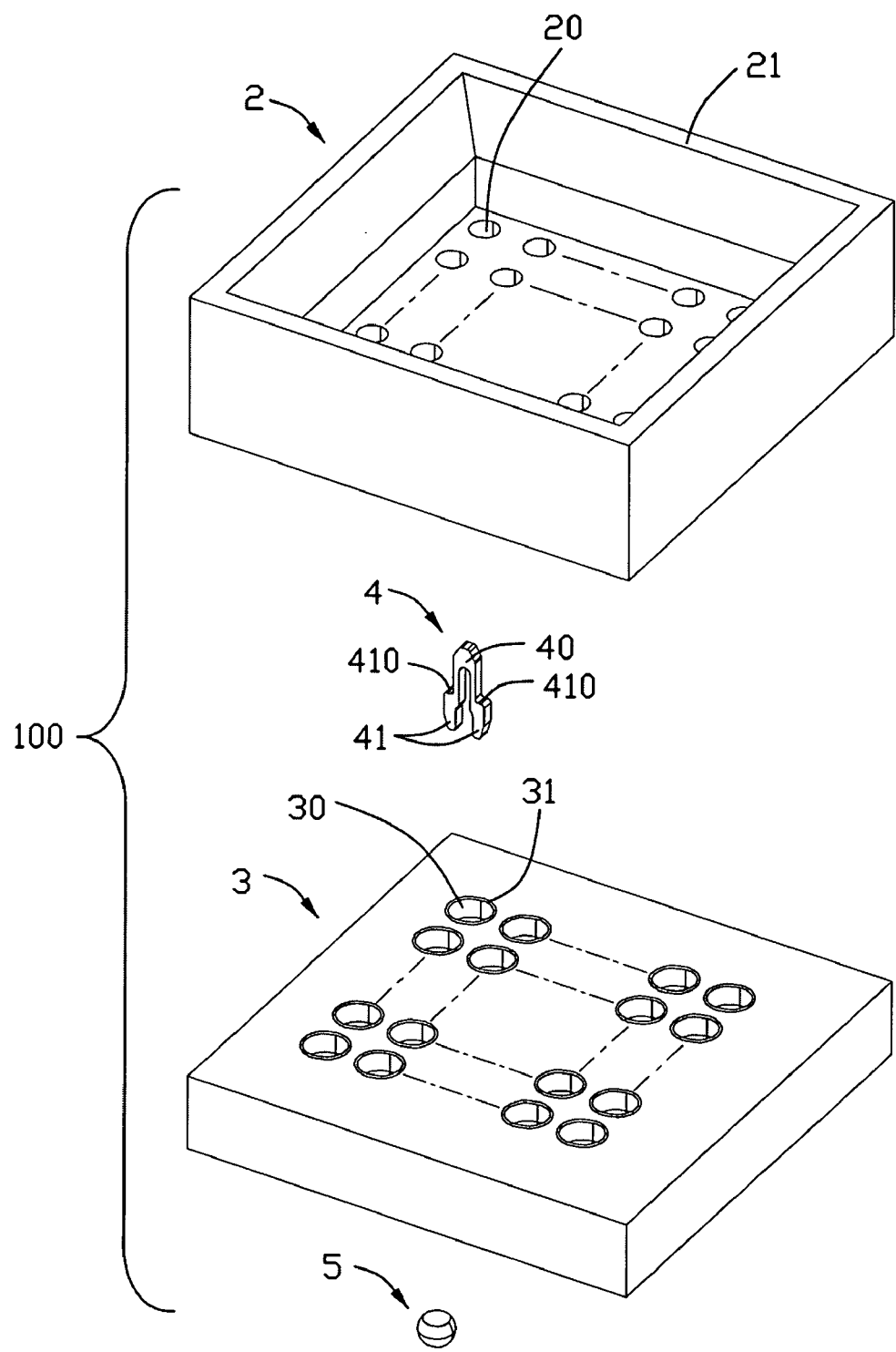
FIG. 2 is an exploded, perspective view of the electrical connector in accordance with the first preferred embodiment of the present invention.
Figure 3A:
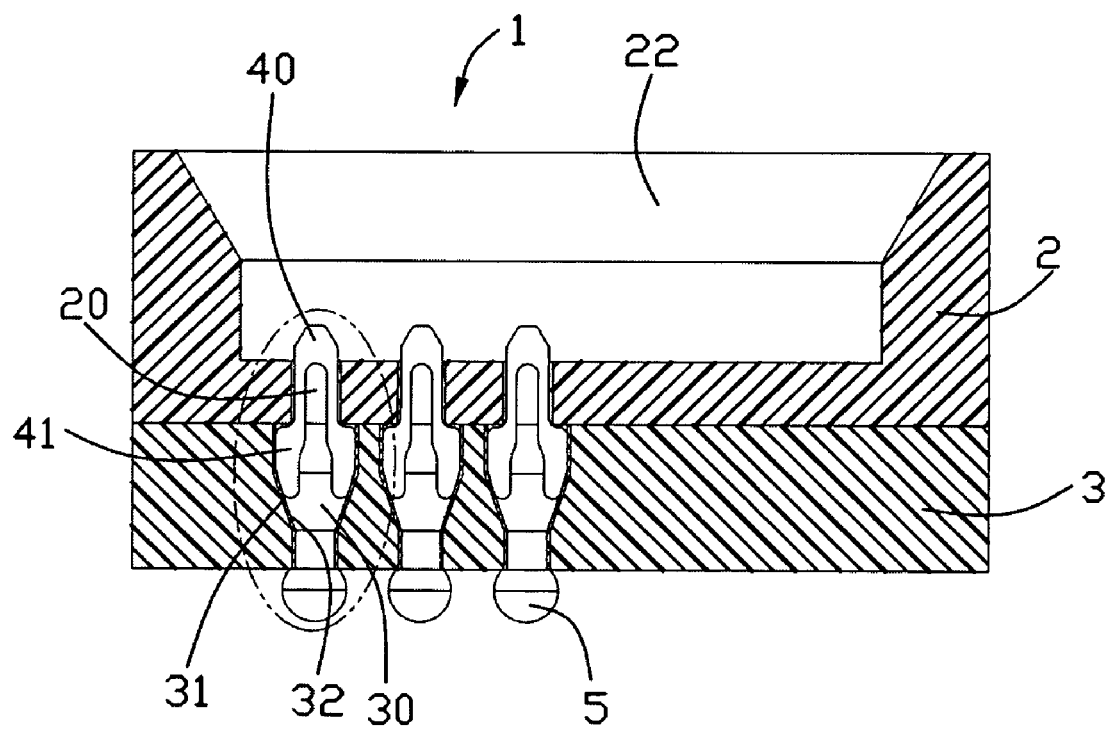
FIG. 3A is a sectional view of the electrical connector, taken from the line 3-3 in FIG. 1.
Figure 3B:
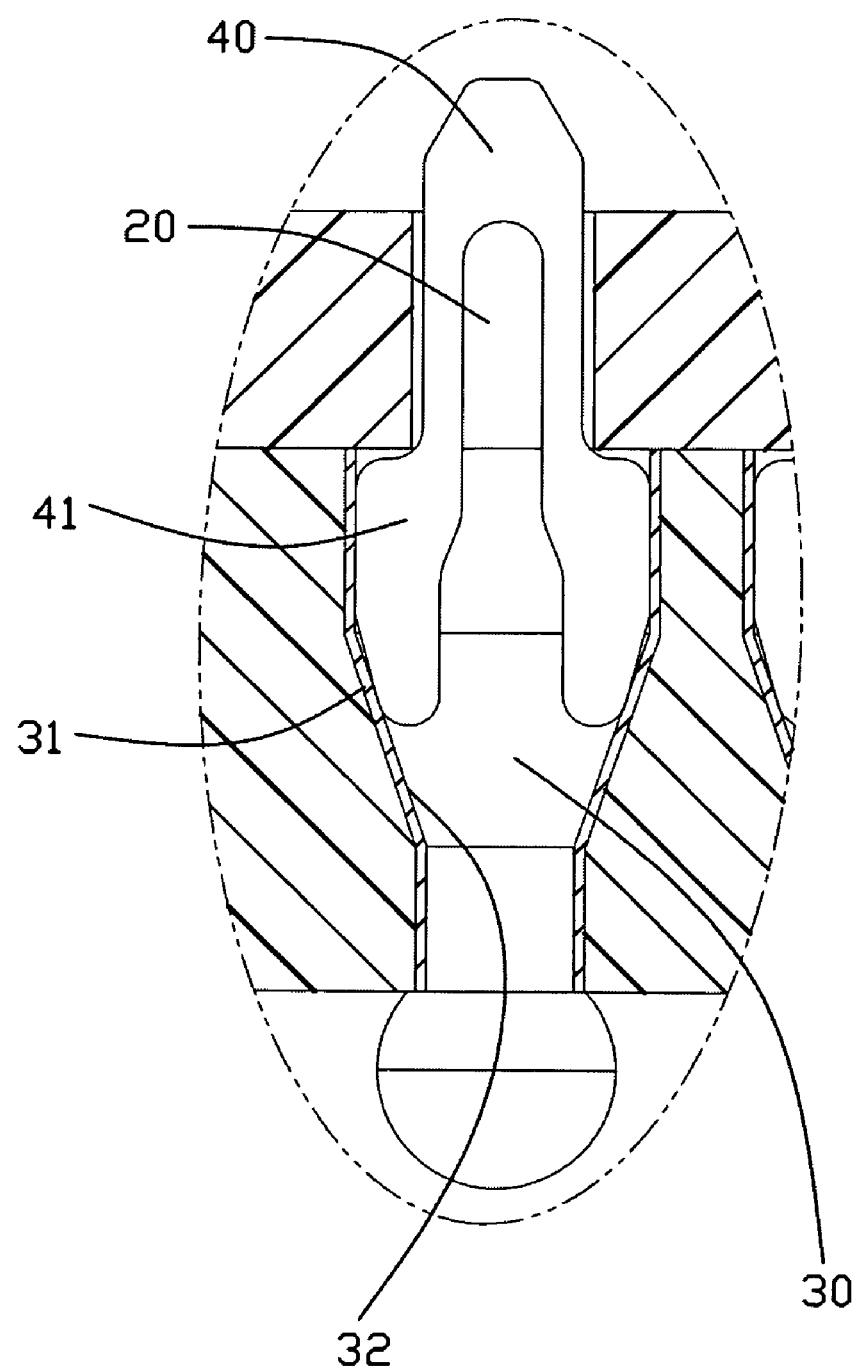
FIG. 3B is an enlarged view of the section labeled by a circle line in FIG. 3A.
Figure 4A:
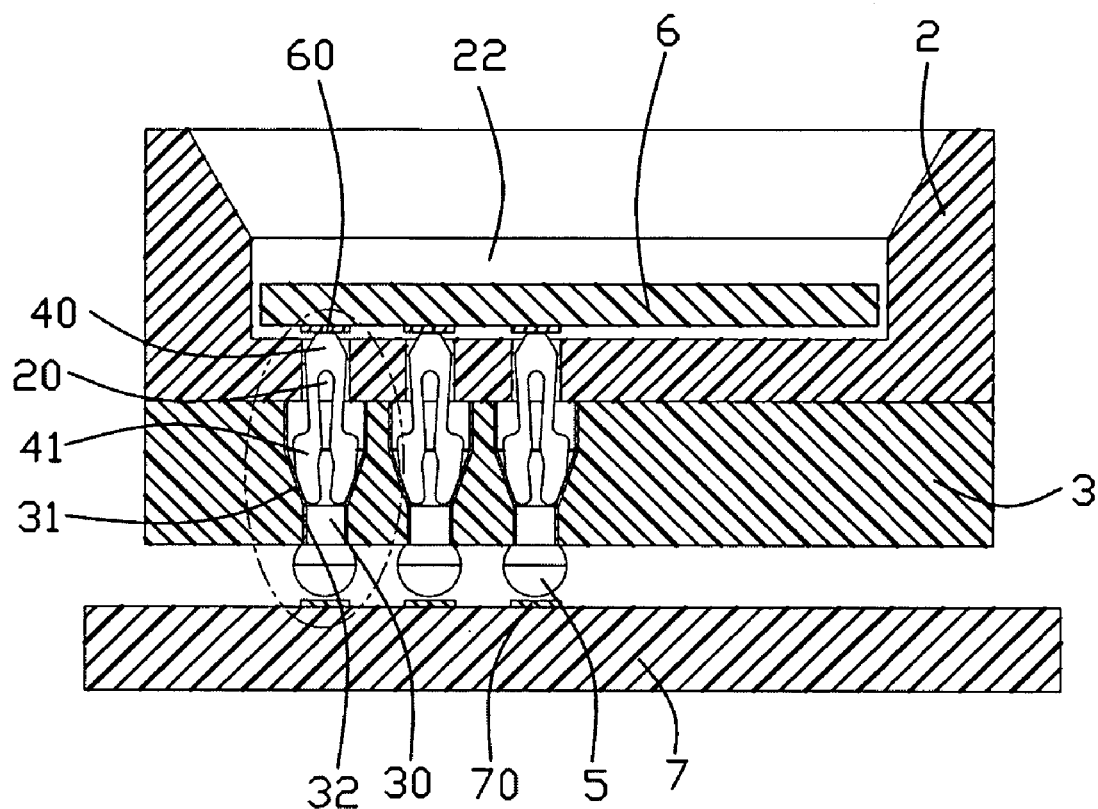
FIG. 4A is another sectional view of the electrical connector, in which an IC package is received therein.
Figure 4B:
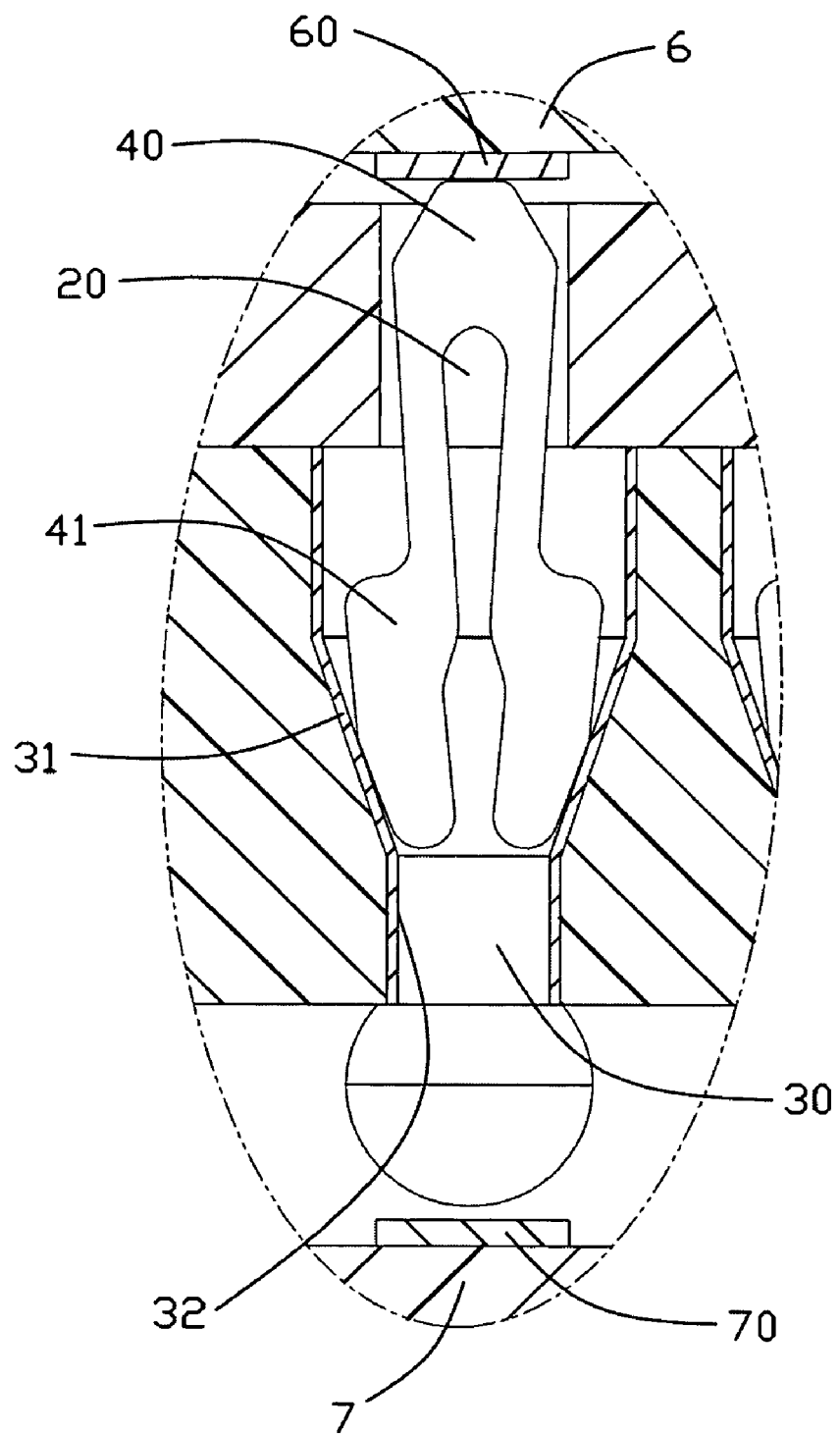
FIG. 4B is an enlarged view of the section labeled by a circle line in FIG. 4A.

FIG. 1 and FIG. 2 respectively illustrate an assembled view and an exploded view of an electrical connector 1 made in accordance to a first preferred embodiment of the present invention. As shown in FIGS. 4A-4B, the electrical connector 1 is used to connect two electronic devices (i.e. an IC package 6 and a printed circuit board 7 in present invention).

The electrical connector 1 includes a first insulative housing 2 and a lower insulative housing 3 disposed under the first housing 2. A plurality of first through holes 20 and second through holes 30 are respectively formed in the first and the second housing 2, 3 and are in alignment with each other in a vertical direction when the first and second housings 2, 3 are stacked together. The first housing 2 is surrounded with four sidewalls so that a cavity 22 is formed to receive the IC package 6 therein. Referring to FIGS. 3A-4B, an inner wall 31 of the through hole 30 of the second housing 3 is plated with a conductive layer 32. The middle section of the inner wall 31 is configured with oblique structure which results a funnel-shape of the second through hole 30. The second through 30 has a upward opening having a bigger diameter than that of the first through hole 20 of the first housing 2. A contacting member (solder ball 5 in the present embodiment) is attached to and electrically connected to the conductive layer 32. The solder ball 5 extends beyond a bottom surface of the second housing 3 and then contacts with a pad 70 on the printed circuit board 7.

Referring to FIGS. 2-4B, the contact 4 includes a contacting portion 40 disposed in the first through hole 20 of the first housing 2 for contacting with a pad 60 of the IC package 6 and a pair of legs 41 extend downwardly to constitute an engaging section which is received in the second through hole 30 of the second housing 3 for engaging the conductive layer 32 plated on the inner wall 31 of the second through hole 30. The contact 4 is a type of stamped contact made by punching process. Each leg 41 has a shoulder section 410 provided to engage with the periphery of the first through hole 20 so as to prevent the contact 4 from escaping away from the first housing 2 and the second housing 3.

When the IC package 6 is loaded into the cavity 22 of the first housing 2 and engaged the contacts 4, the contact 4 is pressed and moves downwardly. The legs 41 deforms because of the engagement with the oblique surface of the second through hole 30, while keeping continuous contact with the conductive layer 32. Via the connection between the contact 4 and conductive layer 32, the IC package is electrically communicated with the circuit in the printed circuit board 7. A normal force that ensures reliable engagement between the contacts 4 and the IC package 6 is produced as a result of the deformation of the legs 41 of the contact 4. When the IC package 6 is released from the electrical connector 1, the contacts 4 move upwardly to an original position under the actuation of the normal force.

Figure 5A:
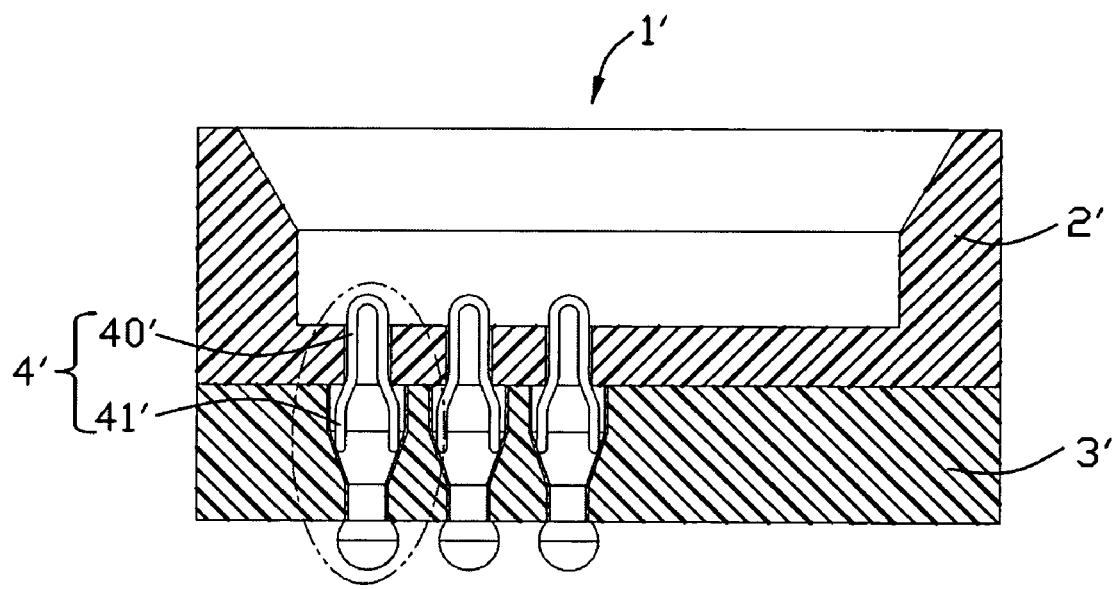
FIG. 5A is a sectional view of an electrical connector in accordance with a second preferred embodiment of the present invention.
Figure 5B:
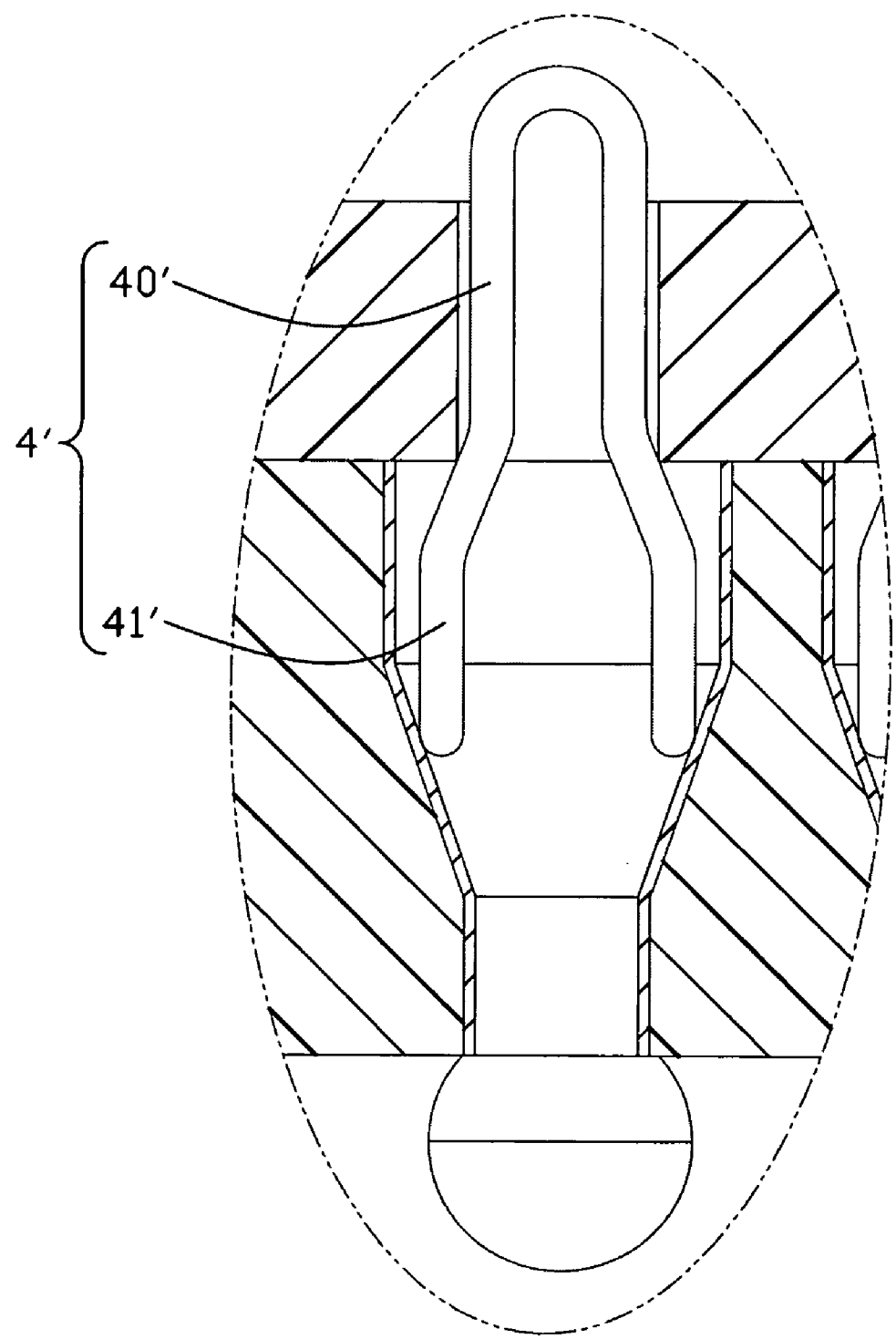
FIG. 5B is an enlarged view of the section labeled by a circle line in FIG. 5A.

FIGS. 5A-5B illustrate a second preferred embodiment of the present invention, which has a similar general structure as the first embodiment. The electrical connector 1' according the second embodiment includes a first insulative housing 2' and a second insulative housing 3' stacked with each other in a vertical direction. A plurality of contacts 4' are floatably mounted in the first and the second housing 2', 3'. The contact 4' includes a contacting portion 40' disposed in the first housing 2' and a pair of legs 41 received in the second housing 3' downwardly. Different from the stamped contacts 4 according to the first embodiment disclosed in FIGS. 1-4B, the contacts 4' of the second embodiment is a formed wire.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector for connecting two electronic devices, comprising:
a first housing having a plurality of first through holes;
a second housing mounted under the first housing and having a plurality of second through holes aligning with the first through holes respectively, an inner wall of the second through hole being plated to have a conductive layer thereon;
a contacting member attached to the conductive layer and disposed beyond a bottom surface of the second housing for engaging with one electronic device; and
a plurality of contacts each comprising a contacting portion disposed in the first through hole for engaging the other electronic device and an engaging section disposed in the second through hole and slideably engaged with the conductive layer.

2. The electrical connector as claimed in claim 1, wherein the inner wall of the second through hole includes an oblique section engaging the engaging section of the contact so as to produce a normal force ensuring reliable connection between the electrical connector and the electronic devices.

3. The electrical connector as claimed in claim 1, wherein the engaging section comprises a pair of deformable legs abutting against the conductive layer.

4. The electrical connector as claimed in claim 1, wherein the second through hole has an opening communicating with the first through hole and having a larger diameter than that of the first through hole, the leg having a shoulder section capable of preventing the contact from escaping away from the first housing and the second housing.

5. The electrical connector as claimed in claim 1, wherein the first housing has multiple sidewalls defining a cavity for receiving one of the electronic device.

6. The electrical connector as claimed in claim 5, wherein, the contacting portion of the contact extends into the cavity but not beyond a top surface of the first housing.

7. The electrical connector as claimed in claim 1, wherein the contact is a stamped-type contact.

8. The electrical connector as claimed in claim 1, wherein the contact is made of a formed wire.

9. The electrical connector as claimed in claim 1, wherein at an interface between the first housing and the second housing, a diameter of the first through hole is smaller than that of the corresponding second through hole so as to prevent the corresponding contact from withdrawal from the second through hole.

10. An electrical connector for connecting two electronic devices, comprising:
a holding arrangement having a plurality of vertical passageways, each of which has an inner surface provided with a plated conductive layer integrally formed thereon; and
a plurality of contacts floatably disposed within the passageways along a vertical direction, each contact having a first end extending out of the passageway so as to engage with one of the electronic device, and a second end contact with the conductive layer.

11. The electrical connector as claimed in claim 10, wherein the holding arrangement includes a first housing and a second housing stacked with each other in the vertical direction, and the passageways includes a first through hole formed in the first housing and a second through hole formed in the second housing, the conductive layer being merely provided in the second through hole.

12. The electrical connector as claimed in claim 11, wherein the first though hole and the second through hole respectively have a downward opening and a upward opening mated with each other and wherein the upward opening has a larger diameter than that of the downward opening so as to provide a step configuration between the downward opening and the upward opening.

13. The electrical connector as claimed in claim 12, wherein the contact has a pair of shoulders engaged with the step configuration.

14. A socket connector, comprising:
a base defining an array of passageways each having an enlarged upper portion and a narrower lower portion with a neck disposed therebetween, the passageway arranged with a conductive layer coated upon an interior surface thereof;
a cover including a planar portion defining an array of openings each aligned with the passageway of the base when the cover is securely stacked over the base; and
a stamped contact disposed within the upper portion of the passageway and the opening of the cover, and including a pair of leg portion spaced from each and complied into the upper portion of the passageway, the contact further including a contact engaging portion that is located within the opening and with a tip projects beyond a top surface of the planar portion.

15. The electrical connector as claimed in claim 14, wherein at an interface between the base and the cover, a diameter of the passageway is larger than that of the corresponding opening.

16. The electrical connector as claimed in claim 14, wherein the opening is dimensioned substantially equivalent to the lower portion of the passageway.

* * * * *